United States Patent [19]

Bowers et al.

[11] Patent Number: 5,410,258
[45] Date of Patent: Apr. 25, 1995

[54] SELF-GUIDING RECEPTACLE FOR A SEMICONDUCTOR TEST SOCKET

[75] Inventors: Derek Bowers; Rennie Bowers, both of Pleasanton; Steven McGarvey, Livermore, all of Calif.

[73] Assignee: DB Design Group, Inc., Santa Clara, Calif.

[21] Appl. No.: 130,351

[22] Filed: Oct. 1, 1993

[51] Int. Cl.6 ............. G01R 31/02; H01R 13/64
[52] U.S. Cl. ............................. 324/755; 439/378
[58] Field of Search ............ 324/158 F, 755, 73.1; 439/375, 378, 379

[56] References Cited

U.S. PATENT DOCUMENTS

| | | | |
|---|---|---|---|
| 1,722,816 | 7/1929 | Meunier | 439/378 |
| 3,106,435 | 10/1963 | Yopp | 439/379 |
| 3,409,857 | 11/1968 | O'Neill et al. | 339/17 |
| 3,447,036 | 5/1969 | Dore et al. | 439/378 |
| 3,487,352 | 12/1969 | Putyato et al. | 439/378 |
| 4,209,216 | 6/1980 | Brooks | 339/65 |
| 4,721,477 | 1/1988 | Lotter | 439/264 |
| 4,753,603 | 6/1988 | Hafstad | 439/375 |
| 4,840,574 | 6/1989 | Mills | 439/378 |
| 4,980,636 | 12/1990 | Romanofsky et al. | 324/158 F |
| 5,032,088 | 7/1991 | Kuramitsu | 439/378 |
| 5,067,911 | 11/1991 | Saeki | 439/526 |
| 5,125,849 | 6/1992 | Briggs et al. | 439/378 |
| 5,208,529 | 5/1993 | Tsurishima et al. | 324/158 F |

FOREIGN PATENT DOCUMENTS

| | | | |
|---|---|---|---|
| 0574347 | 7/1924 | France | 439/378 |
| 0435907 | 10/1926 | Germany | 439/378 |

*Primary Examiner*—Ernest F. Karlsen
*Attorney, Agent, or Firm*—Burns, Doane, Swecker & Mathis

[57] ABSTRACT

A receptacle for a semiconductor test socket has a body with a substantially planar surface and a plurality of female contact pins extending through the planar surface. Each of the female contact pins has an opening at one end through the planar surface. A protuberance extends from the body for insertion into a matching recess in the test socket for pre-aligning the male contact pins with the respective female contact pins on the receptacle.

10 Claims, 3 Drawing Sheets

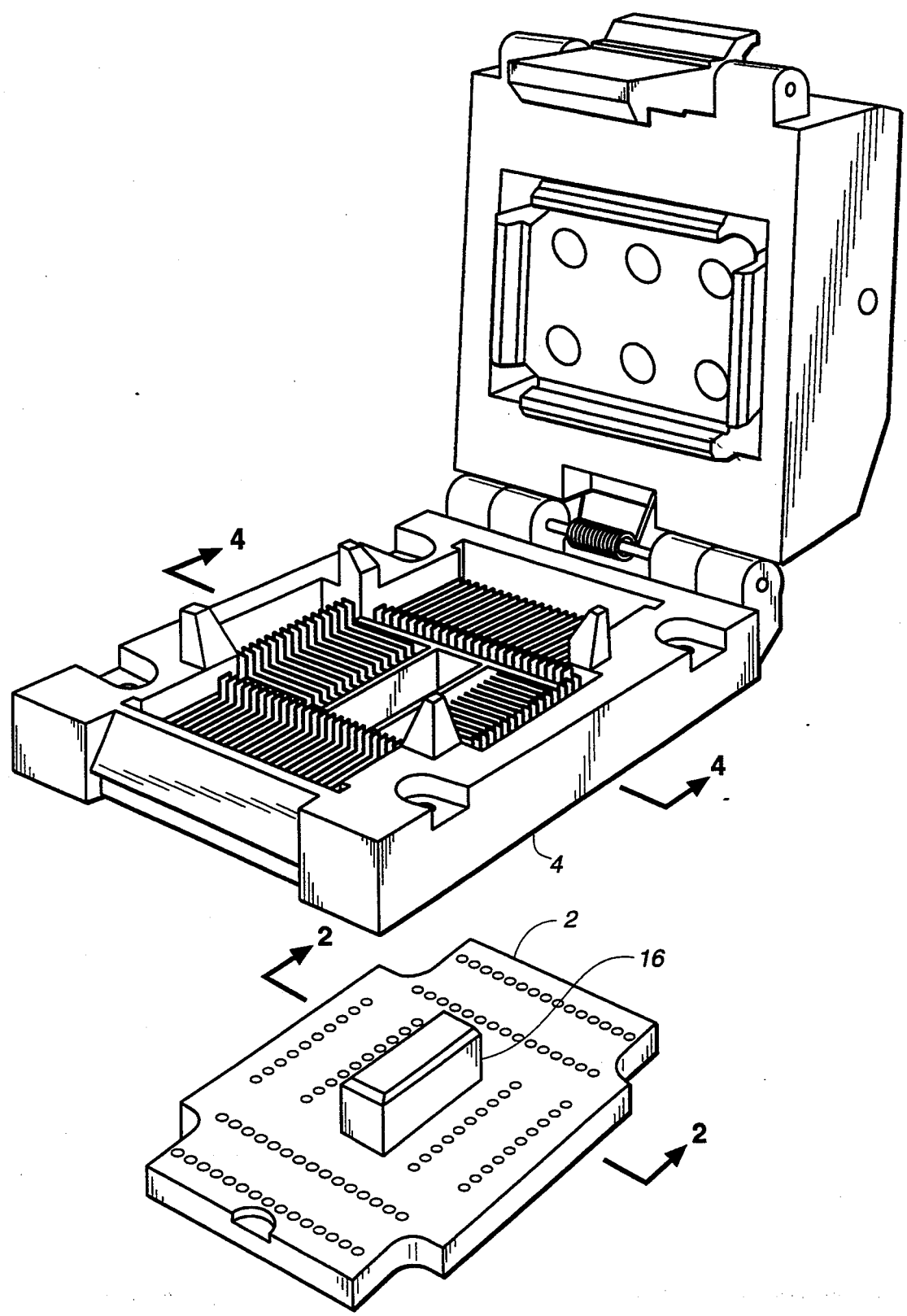
FIG._1

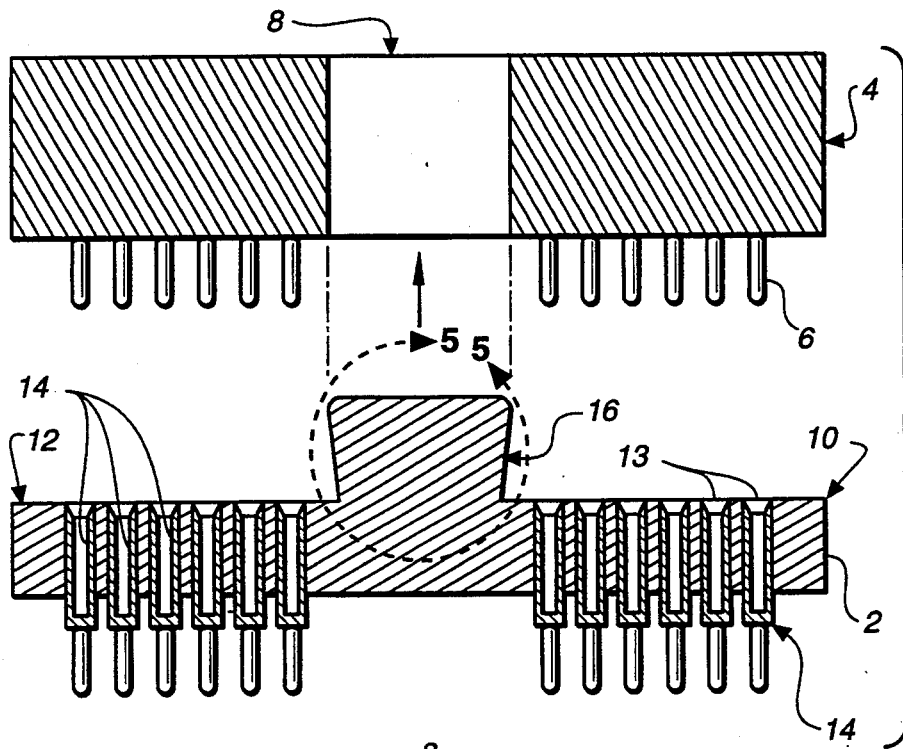
FIG._2
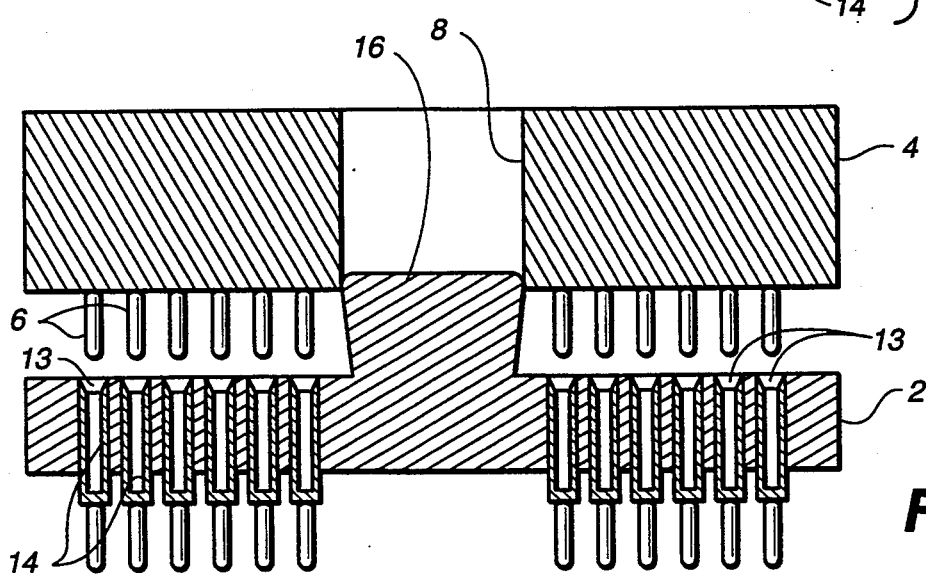
FIG._3
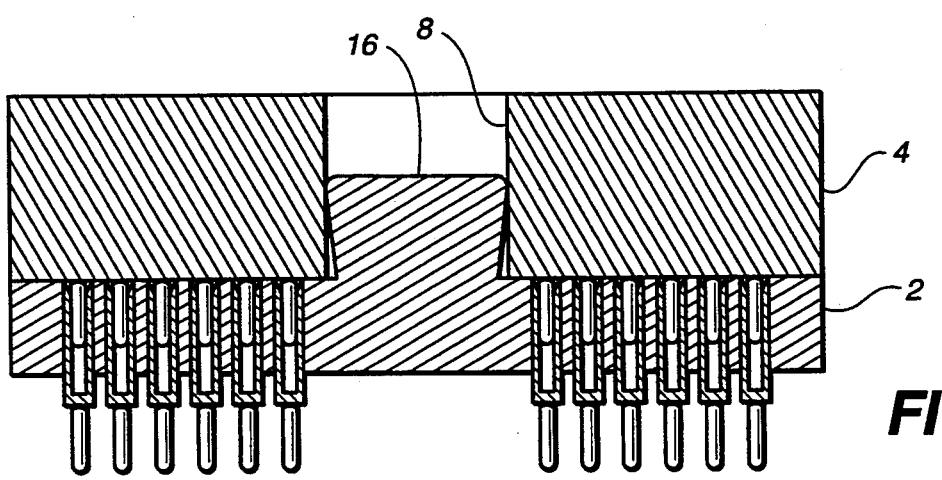
FIG._4

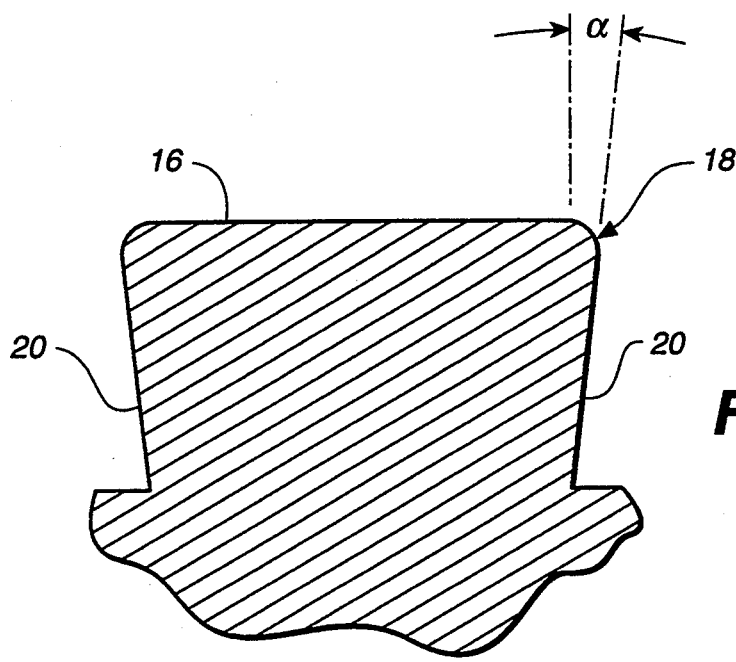
FIG._5
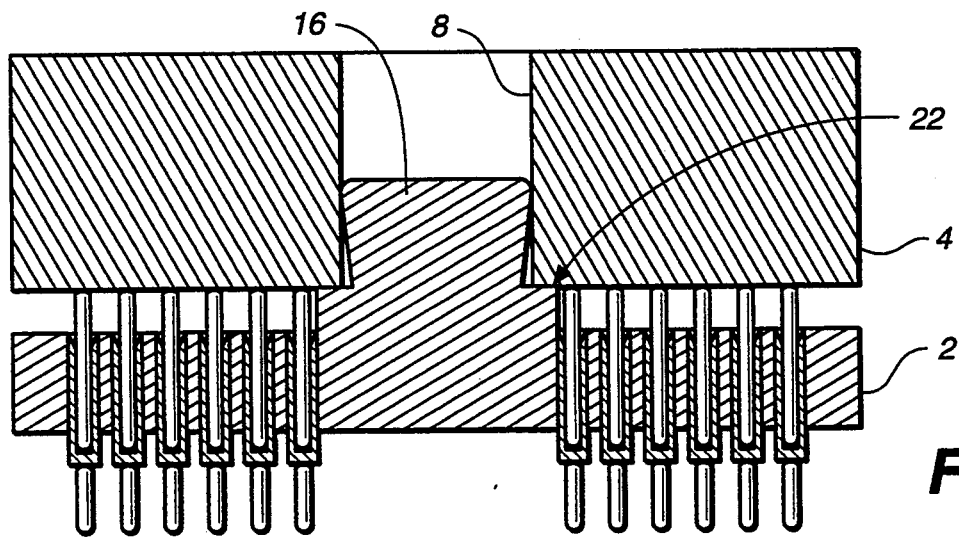
FIG._6
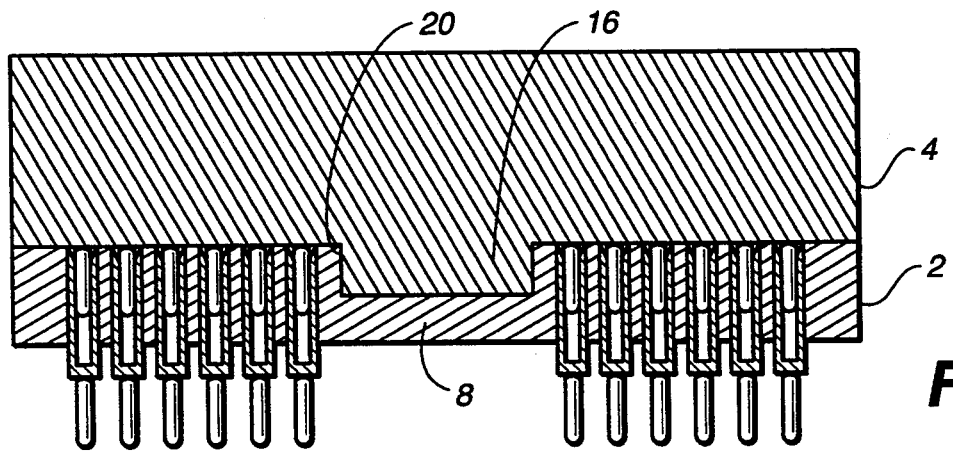
FIG._7

SELF-GUIDING RECEPTACLE FOR A SEMICONDUCTOR TEST SOCKET

BACKGROUND OF THE INVENTION

1. Field of the Invention

The present invention generally relates to systems for testing semiconductor circuits and, more particularly, to systems for connecting semiconductor test sockets to computer-based testing devices.

2. State of the Art

Systems for testing semiconductor devices (i.e., integrated circuit chips) conventionally employ a test socket for receiving and electrically connecting a semiconductor device to a computer-based testing apparatus. The computer-based testing apparatus typically includes a circuit board to which is permanently mounted an intermediate socket (herein referred to as a receptacle) that receives the test socket holding the semiconductor device. The purpose of the receptacle is to reduce wear and tear on the circuit board due to repeated cycles of connecting and disconnecting the test socket from the board. Further, the receptacle allows a user to replace a test socket without affecting the printed circuit board.

In practice, it is sometimes quite difficult to make the connections between test sockets and receptacles. In part, the difficulties arise because the contact pins that extend from test sockets can be easily bent or broken if there is not proper alignment between a test socket and a receptacle. Furthermore, as semiconductor devices become more and more complex, the number of contact pins in the test sockets has increased even while the spacing between the contact pins has decreased.

SUMMARY OF THE INVENTION

The present invention generally provides a pre-alignable receptacle for receiving a semiconductor test socket. In practice, the receptacle includes a body having a plurality of apertures for receiving male contact pins from the test socket and means for pre-aligning the male contact pins with the apertures as the test socket is brought into mating engagement with the receptacle. In the preferred embodiment, the aligning means includes a protruding member (protuberance) that extends from the body of the receptacle for insertion into a recess in the test socket before male contact pins from the test socket are received in the apertures in the receptacle.

In preferred practice, the protuberance is rectangular in cross-section and has a chamfered leading edge. Also in preferred practice, the cross-sectional area of the protuberance is larger on its distal end than near the body of the receptacle. The protuberance can also include a shoulder for abutting an edge of the recess. Still further in preferred practice, the protuberance is centrally located on a face of the receptacle relative to the plurality of female contact pins. Finally in preferred practice, an opening from each of the female contact pins is arranged flush or slightly recessed below the surface of the receptacle.

The present invention also provides a method for connecting a semiconductor test socket to a receptacle on a test apparatus. The method includes the steps of engaging a recess in the test socket with the matching contour of a protruding member on a receptacle, aligning the receptacle with the test socket by inserting the protuberance into the recess, and then connecting pins from the test socket to the engaged receptacle.

BRIEF DESCRIPTION OF THE DRAWINGS

The present invention can be further understood with reference to the following figures in which the like elements have been provided with the same reference numerals. In the drawings:

FIG. 1 is a pictorial view of a semiconductor test socket and a receptacle according to the present invention;

FIG. 2 is a schematic cross-sectional view of the receptacle and test socket of FIG. 1 taken along section lines 2–2' and 4–4', respectively, showing the receptacle and test socket in fully disengaged condition;

FIG. 3 is a view of the test socket and receptacle of FIG. 2 in partial engagement;

FIG. 4 is a view of the test socket and receptacle of FIG. 2 in full engagement;

FIG. 5 is an enlarged detailed view of the circled area in FIG. 2; and

FIG. 6 is a cross-sectional view of an alternative embodiment of the test socket and receptacle of FIG. 1; and FIG. 7 is a cross-sectional view of yet another alternative embodiment of the test socket and receptacle of FIG. 1.

DESCRIPTION OF THE PREFERRED EMBODIMENTS

In the drawings, a receptacle 2 is arranged for mating with a conventional test socket 4. The test socket 4 is designed for receiving an integrated circuit chip (not shown) or other semiconductor device for electrical testing. In the illustrated embodiment, the test socket 4 has a plurality of male contact pins 6 that extend from its lower face toward the receptacle 2. The test socket 4 also includes a recess 8 which is generally centrally located in the face from which the pins extend.

The term recess is used here to include an aperture having opposite open ends (as shown in the present drawings), a slot, a niche, a depression, a dent, a dimple, or other concavity in the face from which male contact pins 6 extend. The recess 8 typically is a rectangular aperture; however, other shapes and lesser depths of penetration through test socket 4 can be provided. The recess 8 can also be arranged in an area of test socket 4 other than the center of the face which meets the receptacle. As will be explained below, the recess 8 assists in pre-aligning and guiding the test socket 4 into proper engagement with the receptacle 2.

In the illustrated embodiment, the receptacle 2 includes a body 10 having a top surface 12 which is substantially planar. The body 10 usually is formed from a non-conductive material such as acrylic resin.

Also in the illustrated embodiment, apertures 13 containing female contact pins 14 are arranged in body 10 for receiving and making electrical contact with the male contact pins 6 on the test socket. Preferably, each female contact pin extends flush or is slightly recessed below the top surface 12 of the receptacle. In practice, the female contact pins 14 are formed from an electrically conductive material which is relatively strong and corrosion resistant to prevent undue deformation and wear. It should be understood that the female contact pins are also used to make electrical connection to a circuit board of a computer-based test apparatus (not shown).

In accordance with the present invention, the receptacle 2 has a protruding member 16—herein referred to as a protuberance or a protuberance means—extending from its planar top surface 12. In the context of defining the present invention, the term protuberance should be understood as including a protrusion, an extension, a lug, an ear, a bump, a lump, a nub, a tongue, or other convex features that extend from the top surface 12. The term also includes a removable extension which protrudes from the top surface 12 of receptacle 2. Further the term protuberance, in the context of defining the present invention, should be understood as including a single protruding member (as illustrated) or a plurality or a multiplicity of protruding members. The purpose of the protuberance 16 is to align and guide the test socket 4 into proper engagement with receptacle 2. In practice, the protuberance 16 normally defines a cross-sectional shape corresponding to the cross-sectional shape (e.g., rectangular in the illustrated embodiment) of recess 8. However, the protuberance can be round, conical, cylindrical, hemispherical, triangular, square, hexagonal, or polygonal or have other shapes in cross-section. Also, the protuberance can be a series of protruding members rather than a single piece.

In the embodiment shown in FIG. 5, the leading edge of protuberance 16 has rounded leading edges achieved by, for example, a chamfer 18 for allowing recess 8 to be easily aligned over and around protuberance 16. Furthermore, in the illustrated embodiment, protuberance 16 has a distal end which is larger in cross-sectional area than the stem of the protuberance 16 which is near to the surface 12 of receptacle 2. The difference in cross-sectional area, in the embodiment shown in FIG. 5, is achieved by forming the side walls 20 of protuberance 16 at an angle α relative to perpendicular to surface 12. Although only two of the angled side walls 20 are shown in the cross-section of FIG. 5, the other walls of protuberance 16 can also be similarly angled.

In operation, the test socket can be rotated or rocked about the distal end of protuberance 16 as the protuberance 16 is being inserted into the recess 8 in the test socket. The capability to rock or rotate is due to the difference in cross-sectional area resulting from the side walls 20 of protuberance 16 being formed at an angle α relative to perpendicular to surface 12. The capability to rock or rotate also results from the clearance distance between the side walls 20 and the inside of the recess 8 near the top surface 12. In practice, the jiggling action is important for aligning the male contact pins 6 with the female contact pins 14. The chamfer 18 also allows the leading edges of protuberance 16 to easily roll against the inside surfaces of recess 8 as the test socket 4 is being aligned with the receptacle 4.

It should be understood that the receptacle 2 can be used with a variety of sockets, some of which will now be described. As an example, FIG. 6 shows an alternative embodiment wherein a protuberance 16 has a shoulder 22 that provides a positive stop for abutting the test socket 4 before it reaches the top surface 12. In practice,, such a shoulder 22 protects the male contact pins from bending, breaking, and from being pushed too far into the receptacle 2.

In the embodiment shown in FIG. 7, is a reciprocal arrangement wherein the receptacle 2 has a recess 8 for receiving a protuberance 16 on test socket 4. In this embodiment, the recess 8 does not extend through receptacle 2 and the protuberance 16 includes side walls 20 which are not angled. However, the protuberance 16 in the test socket 4 of FIG. 7 can include angled side walls 20 similar to FIGS. 2–6. A similarly shaped recess 8 and protuberance 16 can also be used with the receptacle 2 and test socket 4 of FIGS. 2–6.

In normal usage, the recess 8 in test socket 4 is positioned over the protuberance 16 of receptacle 2 (or vice versa) so that the male contact pins 6 are approximately over the openings in female contact pins 14. Then the test socket 4 is moved toward the receptacle 2 until chamfer 18 on the edge of protuberance 16 is inside recess 8. The protuberance 16 is then wiggled back and forth inside recess 8 as the receptacle 2 is moved closer to test socket 4 and male contact pins 6 engage female contact pins 14. At that time, the fully engaged receptacle 2 and test socket 4 are electrically connected to the test apparatus, via a circuit board (not shown).

The principles, preferred embodiments, and modes of operation of the present invention have been described in the foregoing specification. However, the invention should not be construed as limited to the particular embodiments which have been described above. Instead, the embodiments described here should be regarded as illustrative rather than restrictive. Variations and changes can be made by others without departing from the scope of the invention as defined by the following claims.

What is claimed is:

1. An intermediate receptacle for mounting between a semiconductor test socket and a test apparatus, the test socket having a plurality of male contact pins extending from one side, the receptacle comprising:
    a receptacle body including a plurality of male contact pins extending from one side and in electrical communication with a plurality of corresponding female contact pins for receiving at least some of the male contact pins of the semiconductor test socket; and
    protuberance means arranged on the receptacle body between the plurality of female contact pins for aligning the male contact pins of the semiconductor test socket with the female contact pins of the receptacle as the test socket is brought into engagement with the receptacle.

2. The receptacle of claim 1 wherein the protuberance means protrudes from the body for mating with a recess in the test socket.

3. The receptacle of claim 2 wherein the protuberance means is rectangular in cross-section.

4. The receptacle of claim 2 wherein the protuberance means includes a chamfered leading edge.

5. The receptacle of claim 2 wherein the protuberance means includes a distal end which is larger in cross-sectional area than an end near the body.

6. The receptacle of claim 2 wherein the protuberance means has a shoulder for abutting an edge of the recess.

7. The receptacle of claim 2 wherein the protuberance means is comprises a plurality of protruding members which are located between the plurality of female contact pins.

8. An intermediate receptacle for mounting between a semiconductor test socket and a testing apparatus, the test socket having a plurality of male contact pins extending from one side, the receptacle comprising:
    a body having a substantially planar surface;
    a plurality of female contact pins extending perpendicularly through the body, each of the female contact pins having an opening at one end through the planar surface;

a plurality of male contact pins extending from the side opposite of the planar surface, said plurality of male contact pins being in electrical communication with said plurality of female contact pins; and a protuberance centrally located between the female contact pins of the body and extending from the substantially planar surface for mating with a recess in the one side of the test socket and for aligning the male contact pins of the test socket with at least some of the respective female contact pins of the receptacle.

9. The receptacle of claim 8 wherein the protuberance is rectangular with a chamfered leading edge.

10. The receptacle of claim 9 wherein the rectangular protuberance includes a distal end which is larger than an end near the substantially planar surface.

* * * * *